(12) United States Patent
Theron

(10) Patent No.: US 7,609,087 B1
(45) Date of Patent: *Oct. 27, 2009

(54) INTEGRATED CIRCUIT DEVICE PROGRAMMING WITH PARTIAL POWER

(75) Inventor: Conrad A. Theron, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/020,720

(22) Filed: Jan. 28, 2008

Related U.S. Application Data

(62) Division of application No. 10/231,694, filed on Aug. 29, 2002, now Pat. No. 7,346,784.

(51) Int. Cl.
*H03K 19/173* (2006.01)

(52) U.S. Cl. .......................... 326/38; 714/725

(58) Field of Classification Search ............. 326/37–41, 326/47; 714/724–745
See application file for complete search history.

(56) References Cited

U.S. PATENT DOCUMENTS

| 5,473,758 | A | 12/1995 | Allen et al. |
| 6,097,988 | A * | 8/2000 | Tobias ..................... 700/23 |
| 6,232,893 | B1 | 5/2001 | Cliff et al. |
| 6,983,441 | B2 | 1/2006 | Wescott |

* cited by examiner

*Primary Examiner*—James H. Cho
*Assistant Examiner*—Jany Tran
(74) *Attorney, Agent, or Firm*—W. Eric Webostad; LeRoy D. Maunu

(57) ABSTRACT

A separate program power input is provided to a programmable logic array's memory to permit it to be programmed independently of printed circuit board power. Means are provided to isolate the program power input from the array's programmable logic circuit. Means are further provided to isolate the memory from the programmable logic circuit. The program power is not connected directly or indirectly to the programmable logic circuit thereby permitting the use of low-power devices to program the memory without connecting the printed circuit board to a power supply.

9 Claims, 4 Drawing Sheets

INTEGRATED CIRCUIT DEVICE PROGRAMMING WITH PARTIAL POWER

FIELD OF THE INVENTION

The present invention relates generally to programmable memory, and more particularly to methods and means for programming program memories for programmable logic devices.

BACKGROUND OF THE INVENTION

Over the years, means to program memory of integrated circuits, such as program memory for programmable logic devices ("PLDs"), have advanced. Briefly, this progression has been from hard coding a program into ROM, to providing a UV-erasable ROM and then to providing an electrically erasable re-programmable ROM. This leads to memory that is reprogrammable after attachment to a printed circuit board or In-System Programmable ("ISP"). Though this type of arrangement permits an integrated circuit's memory to be programmed or reprogrammed while mounted on a printed circuit board, it requires that the entire printed circuit board be powered up.

Each of these advances has added flexibility to the programming and reprogramming of the integrated circuits. Reprogramming is important, for example, to load test programs into the memory to test the integrated circuit or the system in which the integrated circuit is mounted. For example, in the manufacture of printed circuit boards, special apparatus known as automatic test systems, automated test equipment ("ATE") or "testers" are used to program the integrated circuits with test programs to test the functionality of the integrated circuits and printed circuit boards on which they are mounted. After the automatic test system tests are finished, the automatic test system may program the integrated circuit memory to a customer specified state or erase the integrated circuit to an original unprogrammed state.

Conventionally, Joint Test Action Group ("JTAG") pins, namely, Test Clock ("TCK"), Test Mode Select ("TMS"), Test Data In ("TDI") and Test Data Out ("TDO"), are used for ISP of memory. Because automatic test systems are expensive, time programming and testing a microchip ("chip") or printed circuit board with one or more microchips ("chips") is costly. It would be desirable to pre-program one or more integrated circuits with test programs prior to mounting the printed circuit board or chip on the automatic test system, and be able to re-program the same integrated circuits or chips with operational programs after the printed circuit board has been removed from the automatic test system. This process can reduce the time printed circuit boards are mounted on relatively expensive automatic test systems that currently must themselves program the integrated circuits with either test or operational programs.

Separate JTAG programming devices today require a power supply to be used to power the entire printed circuit board or chip. Especially in instances where a printed circuit board employs a significant number of integrated circuits, such a power supply can be heavy and add to test equipment cost.

Thus, there is a continuing need to provide additional flexibility in in-system programming of memory, especially memory for programming "PLDs", especially when it would be desirable to program only one integrated circuit without providing power to an entire printed circuit board. Thus, it would be desirable to add capability to do "Off-Line" ISP ("OL-ISP"), namely, programming without powering the entire printed circuit board.

SUMMARY OF THE INVENTION

The invention comprises means and methods for independently powering an integrated circuit's programmable memory so that it may be programmed without powering other circuits in the integrated circuit. With power going only to the memory and not to the other circuits of the integrated circuit that typically require a lot more power to operate, a lower-power source may be used to program the memory. This feature is especially important when such an integrated circuit is mounted on a printed circuit board. Here the board is provided with one or more separate program power pins that connect program power to individual integrated circuits independent of the board's main power supply. By powering only the memory of one integrated circuit on an entire printed circuit board, a relative low-power power supply can be used to program the memory.

Other advantages of providing a separate program power supply are that it permits the typically higher voltage necessary to erase and write semiconductor memories to have a source off the chip thereby eliminating the need for on chip charge pumps that are today necessary to raise the main printed circuit board voltage. It further permits the memories of such integrated circuits to be powered up independently of the logic circuits. This reduces the power-up load on the printed circuit board power supplies, thereby reducing voltage and current spikes to other circuits on the board. As well, the memory may be powered up first to place it in a known state prior to powering a PLD's logic.

The invention is useful with any form of programmable integrated circuit memory. In particular, it may be used with flash and electrically erasable memory.

The invention is useful for any form of program-responsive logic on an integrated circuit. The logic can comprise a field programmable gate array (FPGA), a digital signal processor (DSP), a complex programmable logic device (CPLD), or a processor such as a central processing unit (CPU).

In a particular example of the invention, the integrated circuits have means for electrically isolating the programmable memory from the other circuits of the integrated circuit, such as a PLD logic array. Circuit outputs can be set to a high impedance state to electrically isolate the outputs from external circuitry such as other integrated circuits mounted on a printed circuit board. The "program" power supply input may be electrically isolated from the printed circuit board power supply input. This effectively permits the powering of only the integrated circuit's memory without having any of the power drain away to the other circuits within the integrated circuit or to the other integrated circuits mounted on a printed circuit board.

In a further feature of the invention, the integrated circuit made according to the present invention has two power supply inputs: a first input that is connectable to a printed circuit board's power supply, and a second input that is connectable to a low-power "program" power supply. In a first embodiment, the integrated circuit has onboard means for electrically isolating the program power supply input from current loss into the printed circuit board power supply input. In one form, this comprises a diode connected between the program power supply input and the printed circuit board power supply input.

In a second embodiment, the printed circuit board is provided with a multiplexer for selectively providing power to the program power supply input from either the low-power source or to the printed circuit board's power source.

In a further feature of the present invention, the program power supply is connected to a power control means for selectively changing input voltage to the programmable memory. One voltage may be used to reprogram the memory and another voltage may be used to read from the programmable memory.

In a further feature of the present invention, with integrated circuits complying with the JTAG test standard, means are provided to supply a predetermined signal to the TDI input of an integrated circuit on the printed circuit board that does not have a separate program power supply input and that does not recognize the JTAG commands associated with having a separate program power supply.

BRIEF DESCRIPTION OF THE DRAWINGS

The appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
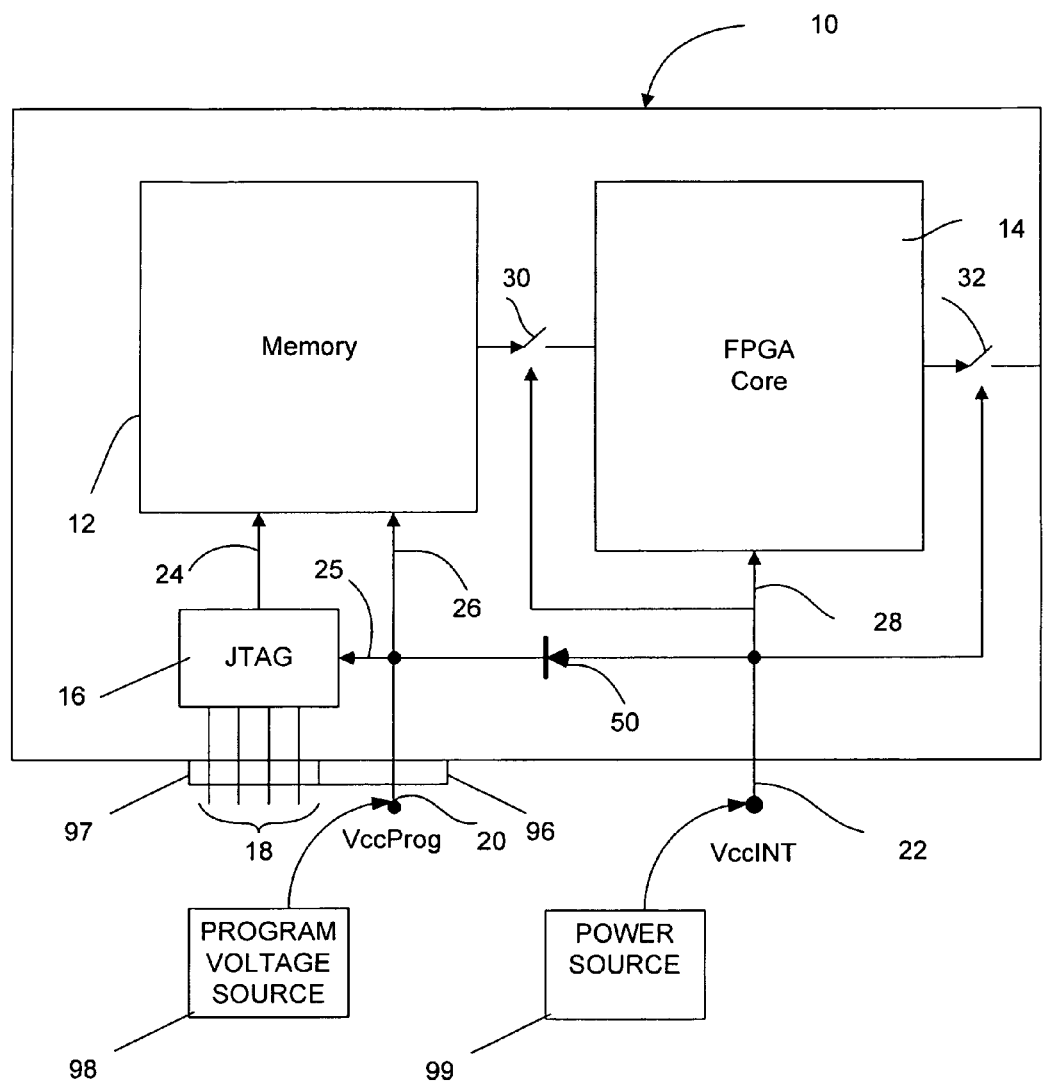
FIG. 1 is a block diagram view of an exemplary embodiment of an integrated circuit in accordance with one or more aspects of the present invention.

FIG. 1 shows a block diagram of an exemplary embodiment of an integrated circuit 10 according to one or more aspects of the present invention. Integrated circuit 10 has three major components: a programmable memory 12, a field programmable gate array ("FPGA") core 14, and JTAG circuit 16. The programmable memory 12 can be any memory that can be selectively reprogrammed, including for example electrically erasable read-only memories or flash circuit memories. As well, FPGA core 14 can be replaced with any major circuit that operates under the control of one or more programs from programmable memory. Examples include other PLDs, DSPs and CPUs.

Integrated circuit 10 further includes a JTAG circuit 16 having JTAG inputs 18 and JTAG test mode output coupled to programmable memory 12. JTAG circuit 16 is used to put memory 12 into a mode to be programmed. Such a mode may include programming FPGA core 14 in response to a program written to memory 12.

The arrangement of major circuit components shown in FIG. 1 constitutes a programmable logic device or PLD 10. JTAG circuit 16 may comprise a Test Access Port ("TAP") controller, instruction registers, data registers, boundary scan cells, and bypass circuits (hereinafter "JTAG controller" 16).

Main power to three major circuit components illustrated in FIG. 1 is provided from a power supply input labeled VccINT 22, conventionally from a printed circuit board's power supply. VccINT 22 is coupled respectively to JTAG controller 16 through diode 50 and input 25, to memory 12 through diode 50 input 26 and to FPGA core 14 through input 28. Diode 50 is oriented in a forward-biased orientation with respect to VccINT 22.

Integrated circuit 10 is further provided with a separate program power supply 20, labeled in the figure as VccProg. This input 20 is also coupled to power supply inputs 25 and 26 to JTAG controller 16 and programmable memory 12 respectively. It is further coupled to diode 50, but so that diode 50 is oriented in a reverse-bias direction with respect to VccProg 20.

Further shown in FIG. 1 are two open (for operational mode) electrical connections, a first selectable coupling 30 between programmable memory 12 and FPGA core 14, and a second selectable coupling 32 between FPGA core 14 and external circuitry. These electrical connections 30 and 32 illustrate the inputs and outputs from major circuit components 12 and 14. They can take many forms from actual switches to tri-stated inputs and outputs, and to unpowered I/O's. Selective connections 30 and 32 may be actively closed and connected when power is applied to VccINT 22 and no power is applied to VccProg 20. Selective connection 30 is open when power is applied to VccProg 20.

In non-VccProg operation, no power is supplied to VccProg 20 and power is applied to VccINT 22 from, for example, a printed circuit board's power supply. This power couples to all three of the major integrated circuit components including JTAG controller 16, programmable memory 12 and FPGA core 14, and to one or more input/output ports. In this configuration, integrated circuit 10 is in a conventionally operable mode. Depending on commands and data given to JTAG controller 16 through JTAG inputs 18, integrated circuit 10 can be configured for normal operation or for test operation.

However, when it is desired to program memory 12 using a higher program voltage, this voltage level is supplied to VccProg. Commands are given to JTAG controller 16 for programming memory 12. Such commands cause both memory 12 and FPGA core 14 to go into a known programming mode state. The program is conventionally input to memory 12 through JTAG controller 16, typically through signal input TDI, and is used to provide test data.

If VccINT 22 is off, memory 12 may still be programmed from a relatively low-power power supply. This may use a higher, lower or the same voltage level as VccINT, but a low-power power supply is instead connected to VccProg input 20. In this configuration, power from VccProg input 20 is input only to JTAG controller 16 and to the programmable memory 12. Interconnection circuits 30 and 32 are opened thereby electrically isolating memory 12 from FPGA core 14. This higher voltage power supply input 20 is connected to the reverse biased side of the diode 50 to prevent current flow to VccINT.

In this mode, power is supplied only to JTAG controller 16 and memory 12. Programmable memory 12 may then be programmed under control of the JTAG controller 16 in a conventional manner. Because power is not coupled to FPGA core 14 in this mode, but rather is electrically isolated therefrom, the power supply connected to VccProg may be of significantly less power than the power supply connected to VccINT. This permits the use of portable battery-operated programming devices. For example, an engineer or technician may have a battery-operated JTAG programmer to selectively program a PLD mounted on a printed circuit board. Alternatively, a printed circuit board may include a battery-operated voltage supply for VccProg.

Notably, a JTAG connector 97 may be coupled to JTAG controller 16 to facilitate a portable JTAG programmer to be put in electrical communication with integrated circuit 10. Accordingly, such a JTAG programmer may comprise of a set of electrical lines or signals (TMS, TCK, TDI and TDO) and a battery 98, or an alternative 'off-board' power source, for supplying VccProg voltage to integrated circuit 10, which voltage is supplied through a connector 96 in the example shown. Signals 18 are used to communicate with JTAG controller 16 to provide instructions and data to program memory 12. Notably, another way of creating a VccProg is to draw power out of JTAG signals 18 sufficient to provide VccProg, among other possibilities. Furthermore, VccINT voltage may be provided from a separate power source, such as power supply 99, associated with operating FPGA core 14.

Figure 2:
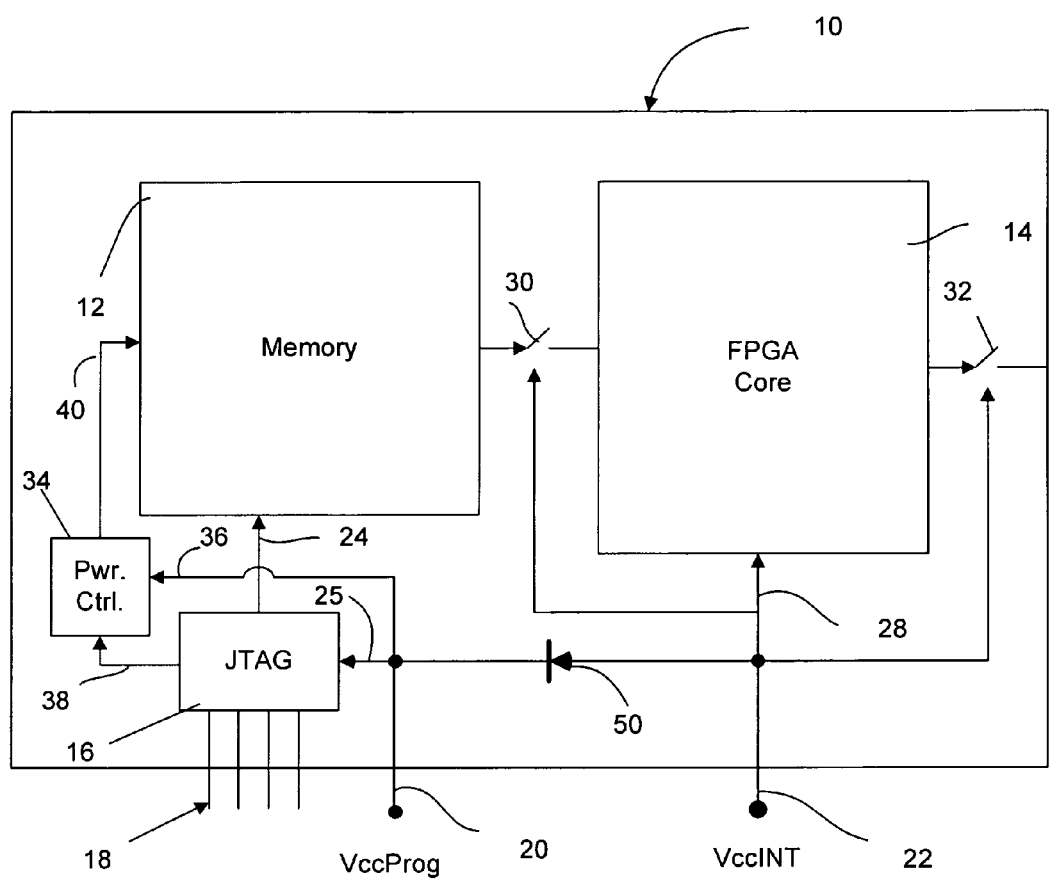
FIG. 2 is a block diagram view of another exemplary embodiment of an integrated circuit in accordance with one or more aspects of the present invention.

FIG. 2 illustrates a block diagram of a second embodiment of the present invention. All of the elements discussed in connection with FIG. 1 are also present in the same combination in the present embodiment, and additionally a power controller 34 is coupled to programmable memory 12. Rather than power being directly input to the programmable memory 12 through an input 26 shown in FIG. 1 that is directly connected to either VccProg or VccINT, the power is connected through power controller 34 that is controlled by JTAG controller 16 through control line 38. The output of power of power controller 34 is input 40 to the programmable memory 12. Depending on the application, power controller 34 will include circuitry that either steps up or steps down the voltage input to it from its input 36 that is connected to both power supply inputs VccProg 20 and VccInt 22, the latter through diode 50. Notably, to step down voltage, power controller 34 may comprise a regulator and not a charge pump. Alternatively, a charge pump and/or regulator of memory 12 may be used. Isolating VccProg 20 from VccINT means that separate voltages may be applied to memory 12 and FPGA core 14 to avoid exposure of FPGA core 14 to such higher voltage.

As discussed above, a programmable memory 12 conventionally uses a higher voltage on its power supply input when it is being programmed. Thus for example if a lower voltage is available on power controller input 36 from either VccProg 20 or VccINT 22, power controller 34 is commanded to boost the voltage on programmable memory power supply input 40 in order that memory 12 may be programmed. One conventional means for boosting the voltage on and integrated circuit is by using a charge pump. Thus, the use of a power controller 34 permits the programming of memory 12 from either the low power VccProg alone or from the higher power VccINT, but in this configuration, both operating at the same low VccINT voltage.

However, if the voltage available on VccProg input 20 is the higher voltage necessary to write to programmable memory 12 for programming purposes, power controller 34 can be selectively commanded to step down the voltage for programmable memory 12 in order to read from the memory using power from the program power supply input VccProg 20 when VccINT power is not available. This will be useful during verification of the programming.

Figure 3:
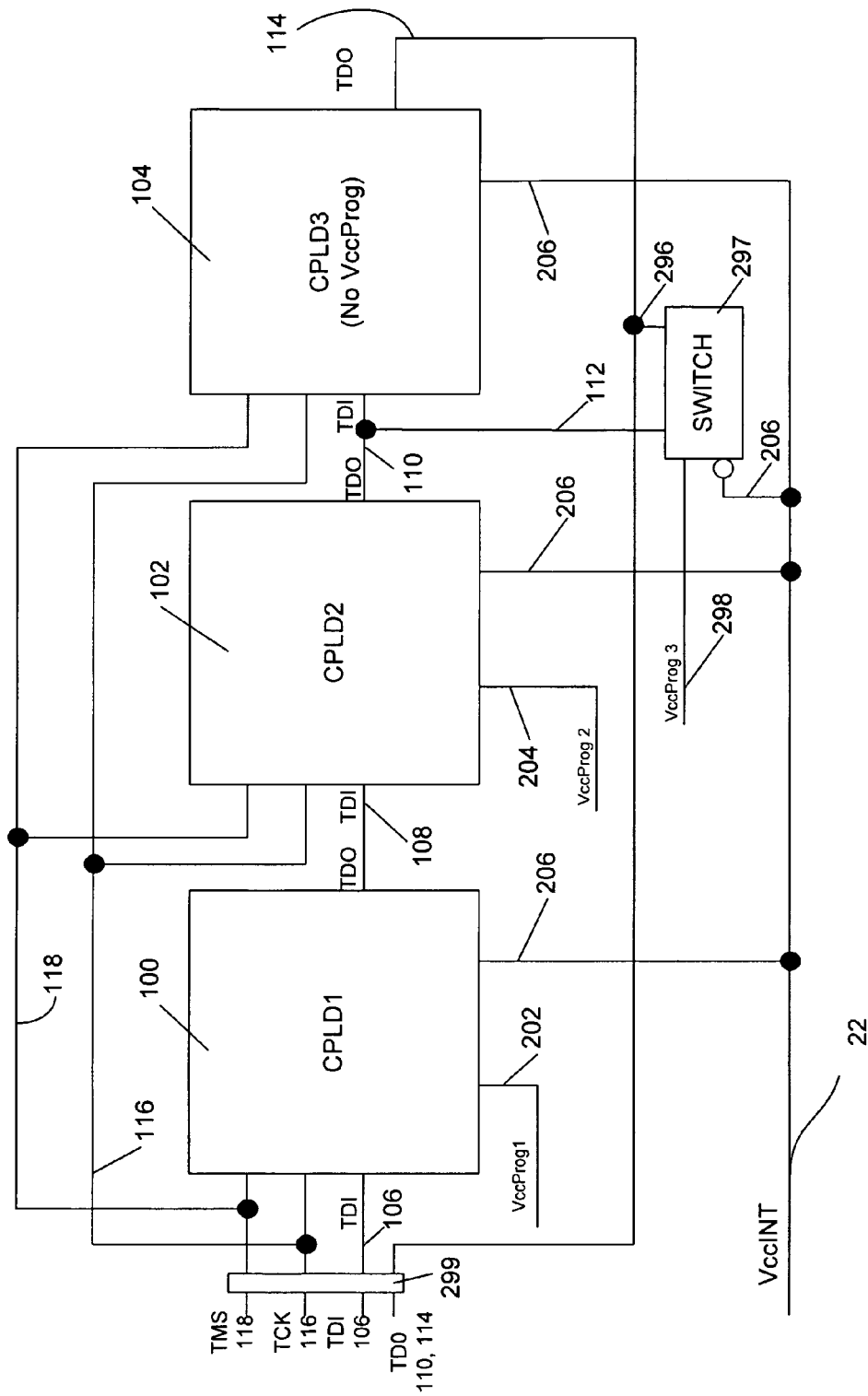
FIG. 3 is a block diagram of several integrated circuits mounted on a printed circuit board together with the manner of connecting their JTAG inputs and outputs according to one or more aspects of the present invention.

FIG. 3 is a block diagram of the electrical connections of several integrated circuits, 100, 102, and 104, as they would appear when the integrated circuits are "mounted" on a printed circuit board. The electrical connections include their JTAG inputs and outputs, which include JTAG control inputs TCK and TMS, 116 and 118, respectively, each connected to every integrated circuit 100, 102, and 104. The JTAG inputs and outputs also include the TDI and TDO data inputs and outputs that serially interconnect the integrated circuits as illustrated in the figure. JTAG inputs TMS 118, TCK 116 and TDI 106 may be coupled to CPLD1 100 through a JTAG connector 299 for coupling to an in-system programming tool such as an ATE or JTAG programmer. A JTAG printed circuit board pin is connected to the TDI input 106 of the first integrated circuit 100, labeled in the figure as CPLD 1. The TDO output of integrated circuit 100 is connected to the TDI input 108 of the second integrated circuit 102, labeled in figure as CPLD 2. Similarly, the output of integrated circuit 102 is connected to the TDI input 110 of the third integrated circuit 104, labeled CPLD 3 in the figure. The TDO output 114 of this last integrated circuit 104 is coupled back for output, such as coupled via JTAG connector 299.

Also shown in FIG. 3 are the power supply inputs to the three integrated circuits 100, 102 and 104. The first two of the circuits, 100 and 102, are made according to the present invention, that is, they have two power supply inputs, VccProg and VccINT. The third integrated circuit 104, is a conventional CPLD circuit that does not have a second program power supply input VccProg. Nor does CPLD 3 recognize the JTAG commands that may be used for CPLD 1 and CPLD 2. CPLD 3 therefore would not know to ignore the high impedance state from CPLD 2 if one or more of the other integrated circuits is programmed using VccProg without turning board power off. In order that the older integrated circuit 104 be integrated onto the same printed circuit board in this environment, a predetermined input must be provided to the TDI input 110 of the third integrated circuit CPLD 3 104. This predetermined input may be provided to the input 110 of the CPLD 3 104 (and any similar integrated circuits) to invoke bypass circuitry to allow TDI 110 to pass to TDO 114 through integrated circuit 104. This will permit the reprogramming of one or more of the other integrated circuits using VccProg without having to turn board power on. However, when VccINT is not active, CPLD3 gets no power to pass TDI 110 to TDO 114, so alternatively to get TDO 110 back to JTAG connector 299, a switch 297 may be used. Notably, switch 297 may be implemented with transistors. When VccProg 3 on input 298 is active, switch 297 couples TDO 110 to output node 296 that couples TDO 110 to JTAG connector 299. VccProg 3 may be a separate voltage or a voltage that is active when at least one of VccProg 1 and VccProg 2 are active. Notably, VccProg 1, 2, and 3 may all be from the same node or source. Switch 297 is powered by VccInt 22 in an active low state. Thus, when VccInt 22 is off, switch 297 is powered and TDO 110 does not pass through CPLD3, and when VccInt 22 is on, switch 297 is off. So when VccINT 22 is active, then 112 is an open which may be detected by CPLD3 to cause it to be put in a bypass mode to pass TDI 110 to TDO 114.

The program power supply inputs to CPLD 1 and CPLD 2 are preferably independent. Thus, two board program power supply pins connect program power VccProg 1 and VccProg 2 to the respective integrated circuit program power supply input pints, 202 and 204 respectively. In contrast, the printed circuit board's internal power supply, VccINT, is connected to all integrated circuits 100, 102, 104 VccINT inputs 206. Thus, respective connections of program power supply 202 and 204 to the respective integrated circuits permits each of integrated circuits 102 or 104 to be individually programmed. If the voltages used to program CPLD1 and CPLD2 are the same, VccProg for both could be from the same power source.

Figure 4:
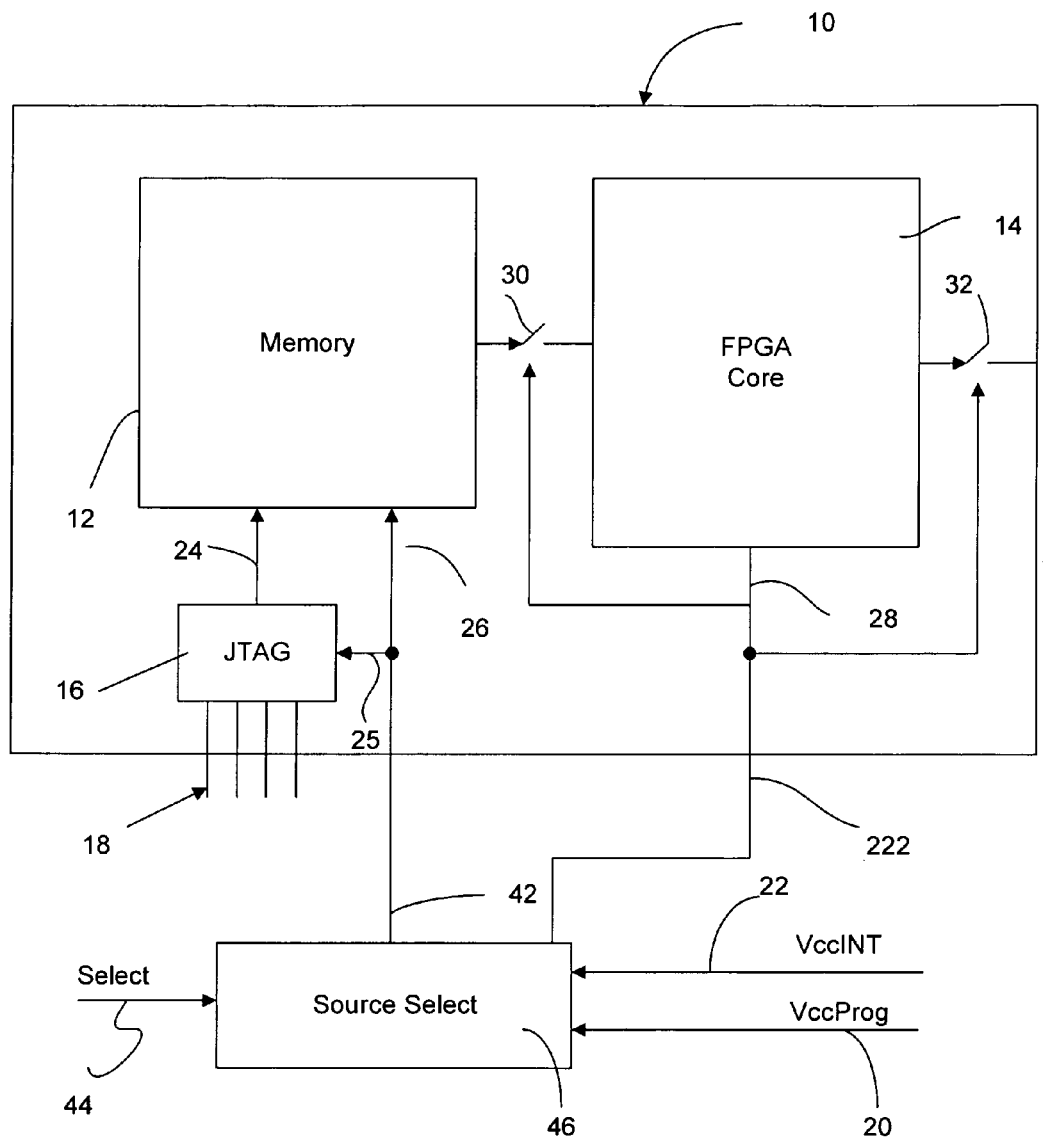
FIG. 4 is a block diagram of yet another exemplary embodiment of an integrated circuit in accordance with one or more aspects of the present invention mounted on a printed circuit board that has a separate power supply selection means mounted on the printed circuit board that selects between a program power supply and a printed circuit board power supply in accordance with one or more aspects of the present invention.

FIG. 4 is a block diagram of an exemplary embodiment integrated circuit 10 in accordance with one or more aspects of the present invention. In this embodiment, a separate power supply source select multiplexer 46 is mounted, for example, on a printed circuit board. Both the main board power VccINT and program power VccProg are provided as inputs to source select 46. Which of the two power inputs is provided as an output 42 is under the control of select signal 44. Output 42 of source select 46 is provided as power input 26 to programmable memory 12 and to power input 25 of JTAG controller 16.

In normal operation, select signal 44 operates source select multiplexer 46 to select VccINT 22. However, when it is desired to program memory 12, the source select 46 instead selects VccProg 20 in response to select signal 44. The provision of a separate off chip source-select multiplexer 46 eliminates the need for an on chip diode 50. The operations of the other elements of the circuit in the figure are as described in connection with the description of FIG. 1.

The provision of a separate program power supply not only permits the integrated circuit to be programmed using a lower-power power supply, it also permits the system designer to selectively power up the memory 12 prior to powering up FPGA core 14. This has advantages in that not all circuit components are drawing power at the same time. This reduces demands on the board power supply. This reduced demand of power, reduces voltage and current spikes. Furthermore, it decreases the chance of so-called race conditions between circuits on the board becoming active at the same time. Furthermore, ISP may be done without using expensive ATE equipment. Also, one or more FPGAs and associated memory may be mounted on a plurality of circuit boards having JTAG connectors, as described above. These circuit boards may be on racks in a factory. A user-programmer may have a portable JTAG programmer for communicating with a circuit board to remotely program memory for the FPGAs. This can be especially cost effective as programming time on an ATE, which is significantly more expensive than a portable JTAG programmer, may be conserved by pre-programming prior to testing.

The foregoing discussion of the preferred embodiments is not to be taken as a limitation on the scope of the present invention. Particularly, such variations that one of ordinary skill may make to enhance or vary the operation of the various elements heretofore described are deemed to be within the scope of claims appended hereto. In claims listing method steps, it is not to be assumed that the steps must occur in the order stated.

What is claimed is:

1. A system, comprising:
  a printed circuit board; and
  a plurality of programmable devices, a first subset of the programmable devices configured for functioning in one of a board power supply mode and a separate program voltage mode, a second subset of the programmable devices configured for functioning in the board power supply mode and not configured for functioning in the separate program voltage mode,
  wherein the plurality of devices are mounted on the printed circuit board; and
  wherein for a test signal output from a first programmable device in the first subset and input to a second programmable device in the second subset, the second programmable device is configured to pass the test signal to an output pin of the second programmable device in response to the first programmable device functioning in the program voltage mode.

2. The system according to claim 1 wherein the plurality of programmable devices are coupled in series with respect to direction of test data flow.

3. The system according to claim 2 wherein the plurality of programmable devices forms a loop with respect to the direction of test data flow.

4. The system of claim 1, wherein:
  each programmable device in the first subset has a board power supply input and a program voltage input;
  each programmable device in the second subset has a board power supply input and does not have a program voltage input;
  the board power supply inputs are coupled to receive a board voltage level; and
  the program voltage inputs are coupled to receive one or more program voltage levels that are not equal to the board voltage level.

5. The system of claim 1, wherein the programmable device is selected from the group consisting of a field programmable gate array, a digital signal processor, a complex programmable logic device and a processor.

6. A system, comprising:
  a printed circuit board; and
  a plurality of programmable devices, a first subset of the programmable devices configured for functioning in one of a board power supply mode and a separate program voltage mode, a second subset of the programmable devices configured for functioning in the board power supply mode and not configured for functioning in the separate program voltage mode, the second portion of the programmable devices being isolated during presence of the separate program voltage mode,
  wherein the plurality of devices are mounted on the printed circuit board; and
  wherein for a first programmable device in the first subset coupled to provide an input signal to a second programmable device in the second subset, the second programmable device is isolated from the first programmable device in response to the first programmable device functioning in the program voltage mode.

7. The system according to claim 6 wherein the plurality of programmable devices are coupled in series with respect to direction of test data flow.

8. The system according to claim 7 wherein the plurality of programmable devices forms a loop with respect to the direction test data flow.

9. The system of claim 4, further comprising a switch coupled to receive the test signal from the first programmable device, the switch configured to switch on and pass the test signal in response to the board voltage level being in a power-off state and the program voltage level for the first programmable device being in an active state.

* * * * *